(12) United States Patent
Kim et al.

(10) Patent No.: US 8,889,994 B2
(45) Date of Patent: Nov. 18, 2014

(54) SINGLE-LAYERED PRINTED CIRCUIT BOARD AND MANUFACTURING METHOD THEREOF

(75) Inventors: Young-Ji Kim, Daejeon (KR);
Kyung-Ro Yoon, Daejeon (KR);
Sang-Duck Kim, Chungjoo-si (KR);
Jung-Hyun Park, Hwasung-si (KR);
Nam-Keun Oh, Daejeon (KR);
Jong-Gyu Choi, Choongchungnam-Do (KR); Ji-Eun Kim, Gwangmyung-si (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 417 days.

(21) Appl. No.: 13/018,971

(22) Filed: Feb. 1, 2011

(65) Prior Publication Data

US 2011/0186342 A1     Aug. 4, 2011

(30) Foreign Application Priority Data

Feb. 1, 2010   (KR) .................. 10-2010-0009192

(51) Int. Cl.
*H05K 1/16*          (2006.01)
(52) U.S. Cl.
USPC ............... 174/260; 174/262; 29/840; 29/847
(58) Field of Classification Search
CPC ....... H05K 1/111; H05K 1/113; H05K 1/114; H05K 1/115; H05K 1/116; H05K 1/117
USPC ............ 174/260, 262–266; 257/780; 29/830, 29/840, 847
See application file for complete search history.

(56) References Cited

U.S. PATENT DOCUMENTS

| | | | | |
|---|---|---|---|---|
| 6,222,136 | B1* | 4/2001 | Appelt et al. | 174/254 |
| 6,852,564 | B2* | 2/2005 | Ohuchi et al. | 438/68 |
| 7,164,208 | B2* | 1/2007 | Kainou et al. | 257/780 |
| 7,420,285 | B2* | 9/2008 | Hashimoto | 257/781 |
| 2007/0034401 | A1* | 2/2007 | Shim | 174/250 |
| 2009/0224409 | A1* | 9/2009 | Miyata et al. | 257/774 |
| 2011/0117700 | A1* | 5/2011 | Weng et al. | 438/109 |

\* cited by examiner

*Primary Examiner* — Jeremy C Norris
(74) *Attorney, Agent, or Firm* — McDermott Will & Emery LLP

(57) ABSTRACT

A single layered printed circuit board and a method of manufacturing the same are disclosed. In accordance with an embodiment of the present invention, the method can include forming a bonding pad, a circuit pattern and a post on a surface of an insulation film, in which one end part of the post is electrically connected to at least a portion of the circuit pattern, pressing an insulator on the surface of the insulation film, in which the circuit pattern and the post are buried in the insulator, selectively etching the insulator such that the other end part of the post is exposed, and opening a portion of the insulation film such that at least a portion of the bonding pad is exposed.

11 Claims, 16 Drawing Sheets

SINGLE-LAYERED PRINTED CIRCUIT BOARD AND MANUFACTURING METHOD THEREOF

CROSS-REFERENCE TO RELATED APPLICATIONS

This application claims the benefit of Korean Patent Application No. 10-2010-0009192, filed with the Korean Intellectual Property Office on Feb. 1, 2010, the disclosure of which is incorporated herein by reference in its entirety.

BACKGROUND

1. Technical Field

The present invention is related to a single-layered printed circuit board and a manufacturing method thereof 2. Description of the Related Art Compared to the conventional electronic devices, the latest electronic devices have become increasingly smaller. For this, there has been a demand for smaller-size, higher-performance semiconductor chip packages. A lead frame was often used to install a semiconductor chip on the main board in the past. Today, however, an interposer is also used for the printed circuit board as the number of input/output terminals in the semiconductor chip has been increased.

Together with the trend described above, there has been a growing demand for smaller, thinner and high-end mobile devices, for example, mobile phones. Accordingly, the printed circuit board being used as the interposer is also required to be smaller and to have higher density. This results in an increasing demand for thinner printed circuit boards and finer-pitch circuit patterns.

SUMMARY

The present invention provides a single-layered printed circuit board and a manufacturing method of the single-layered printed circuit board that can implement higher density and save the production cost.

An aspect of the present invention provides a method of manufacturing a single-layered printed circuit board. In accordance with an embodiment of the present invention, the method can include forming a bonding pad, a circuit pattern and a post on a surface of an insulation film, in which one end part of the post is electrically connected to at least a portion of the circuit pattern, pressing an insulator on the surface of the insulation film, in which the circuit pattern and the post are buried in the insulator, selectively etching the insulator such that the other end part of the post is exposed, and opening a portion of the insulation film such that at least a portion of the bonding pad is exposed.

The insulation film can be made of a material comprising polyimide.

The forming of the bonding pad, the circuit pattern and the post can include adhering an insulation film to both surfaces of a separator, forming the bonding pad, the circuit pattern and the post on the insulation film formed on both surfaces of the separator, and separating the insulation film on both surfaces of the separator from the separator.

At least one of the selectively etching of the insulator and the opening of a portion of the insulation film can be performed by way of laser direct ablation (LDA).

The method can further include coupling a solder ball to the other end part of the post and mounting an electronic component on an upper side of the insulator such that the electronic component is connected to the exposed bonding pad by a flip-chip method.

An aspect of the present invention provides a method of manufacturing a single-layered printed circuit board. In accordance with an embodiment of the present invention, the method can include forming a residual film and a post by selectively etching one surface of a metal plate, pressing an insulator on one surface of the metal plate, in which the post is buried in the insulator and the residual film is stacked on a surface of the insulator, forming a circuit pattern and a bonding pad by patterning the residual film, selectively etching the insulator such that an end part of the post is exposed, and coating a solder resist such that at least a portion of the bonding pad is exposed.

The selectively etching of the insulator can be performed by way of laser direct ablation (LDA).

The method can further include coupling a solder ball to the exposed end part of the post and mounting an electronic component on an upper side of the insulator such that the electronic component is connected to the exposed bonding pad by a flip-chip method.

Yet another aspect of the present invention provides a single-layered printed circuit board. In accordance with an embodiment of the present invention, the single-layered printed circuit board can include an insulator, a bonding pad and a circuit pattern, which are provided on one surface of the insulator, a solder resist, which covers the circuit pattern and is coated on the insulator such that at least a portion of the bonding pad is exposed, a groove, which is formed on the other surface of the insulator, and a post, which penetrates through the insulator and in which one end part of the post is electrically connected to at least a portion of the circuit pattern and the other end part of the post is exposed through the groove.

The bonding pad and the circuit pattern can be buried in the insulator.

The single-layered printed circuit board can further include a solder ball, which is coupled to the exposed end part of the post, and an electronic component, which is mounted on an upper side of the insulator such that the electronic component is connected to the exposed bonding pad by a flip-chip method.

Additional aspects and advantages of the present invention will be set forth in part in the description which follows, and in part will be obvious from the description, or may be learned by practice of the invention.

DETAILED DESCRIPTION

Figure 1:
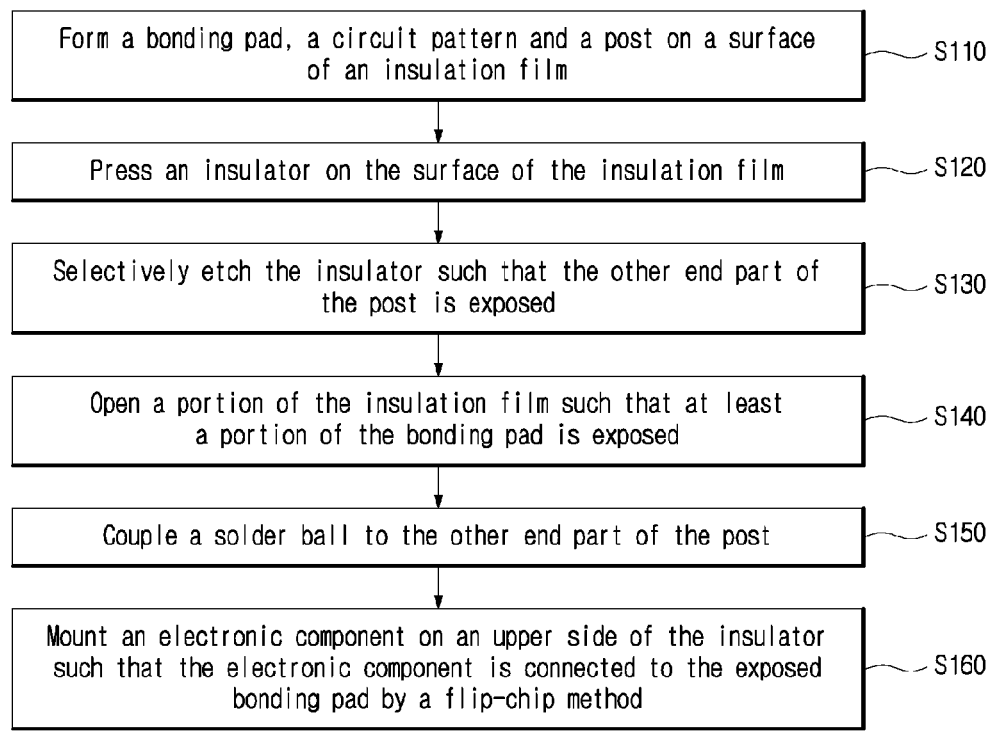
FIG. 1 is a flow diagram illustrating a method of manufacturing a single-layered printed circuit board in accordance with an embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed descriptions of related art are omitted when it is deemed that they may unnecessarily obscure the essence of the invention.

While such terms as "first," "second," etc. may be used to describe various components, such components must not be limited to the above terms. The above terms are used only to distinguish one component from another.

A single-layered printed circuit board and a manufacturing method of the single-layered printed circuit board in accordance with certain embodiments of the present invention will be described below in more detail with reference to the accompanying drawings. Those components that are the same or are in correspondence are rendered the same reference numeral regardless of the figure number, and redundant descriptions are omitted.

First, a method of manufacturing a single-layered printed circuit board in accordance with an embodiment of the present invention will be described with reference to FIGS. 1 to 7. FIG. 1 is a flow diagram illustrating a method of manufacturing a single-layered printed circuit board in accordance with an embodiment of the present invention, and FIGS. 2 to 7 are diagrams illustrating each process of manufacturing a single-layered printed circuit board in accordance with an embodiment of the present invention.

Figure 2:
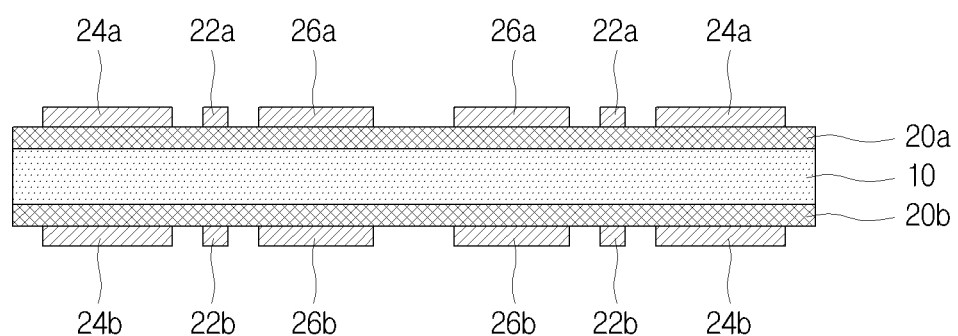
FIGS. 2 to 7 are diagrams illustrating each process of manufacturing a single-layered printed circuit board in accordance with an embodiment of the present invention.
Figure 3:
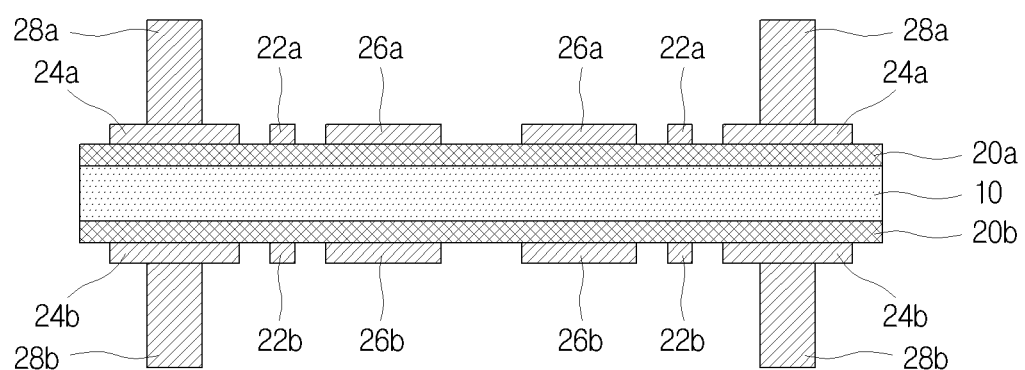

First, bonding pads 26a and 26b, circuit patterns 22a, 22b, 24a and 24b and posts 28a and 28b, one end of which is electrically connected to at least a portion of the circuit patterns 22a, 22b, 24a and 24b, are formed on the surfaces of insulation films 20a and 20b (S110, refer to FIGS. 2 and 3). Here, the bonding pads 26a and 26b refer to parts that transceive electrical signals by being connected to electrodes of an electronic component, and the circuit patterns include wiring patterns 22a and 22b, which transmit electrical signals, and lands 24a and 24b, which have a relatively wider surface area than that of the wiring patterns 22a and 22b such that the lands 24a and 24b are connected to the posts 28a and 28b. Hereinafter, the wiring patterns 22a and 22b and the lands 24a and 24b will be collectively referred to as the term "circuit pattern"

For this, the bonding pads 26a and 26b and the circuit patterns 22a, 22b, 24a and 24b are formed on the surfaces of the insulation films 20a and 20b, as illustrated in FIG. 2, and then the posts 28a and 28b are formed on upper sides of the lands 24a and 24b, as illustrated in FIG. 3. Here, the insulation films 20a and 20b can be made of polyimide or a material mainly including polyimide. The insulation films 20a and 20b can function as a solder resist in a following process. This will be described later in more detail.

In order to form the post 28a and 28b on the lands 24a and 24b, a patterned plating resist (not shown) can be formed on the insulation films 20a and 20b, on which the bonding pads 26a and 26b and the circuit patterns 22a, 22b, 24a and 24b are formed, and then plating can be selectively performed on upper sides of the lands 24a and 24b only. It is also possible that other various printing methods, other than the plating method, can be employed.

In order to form the bonding pads 26a and 26b and the circuit patterns 22a, 22b, 24a and 24b on the surfaces of the insulation films 20a and 20b, a metal clad laminate in which the insulation films 20a and 20b and a metal film (not shown) are stacked with one another can be prepared, and then a patterned etching resist (not shown) can be formed on the surface of the metal film, followed by selective etching on the metal film. Additionally, it is also possible that the bonding pads and the circuit patterns are formed by successively performing electroless plating and electroplating on the insulation films 20a and 20b. Also, other various methods, such as inkjet printing, can be employed.

Figure 4:
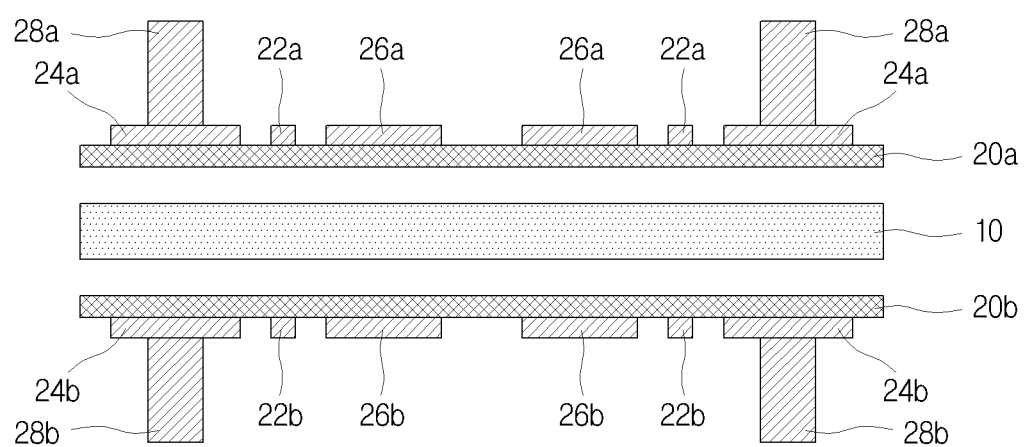

Meanwhile, the above processes can be simultaneously performed on both sides of a separator 10, as illustrated in FIGS. 2 to 4. Specifically, after adhering the insulation films 20a and 20b to both surfaces of the separator 10, respectively (refer to FIG. 2), the bonding pads 24a and 24b, the circuit patterns 22a, 22b, 24a and 24b and the posts 28a and 28b are formed on each of the insulation films 20a and 20b, which are formed on either surface of the separator 10 (refer to FIG. 3), and then the insulation films 20a and 20b are separated from the separator 10 (refer to FIG. 4). By employing this method, two pieces of products can be obtained by one single process, and thus an improved production efficiency can be expected.

Figure 5:
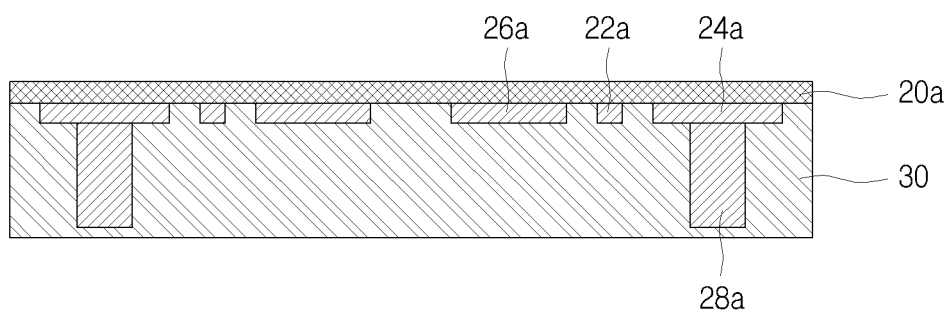

After forming the posts 28a and 28b as described above, an insulator 30 is pressed on the surface of the insulation film 20a, as illustrated in FIG. 5 (S120). Specifically, the insulator 30 is pressed on one surface of the insulation film 20a, on which the bonding pad 26a, the circuit patterns 22a and 24a and the post 28a are formed. As a result, the bonding pad 26a, the circuit patterns 22a and 24a and the post 28a are buried in the insulator 30, as illustrated in FIG. 5.

Figure 6:
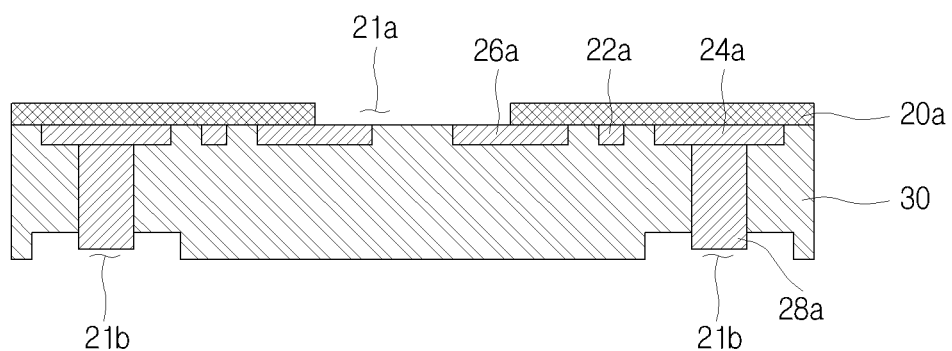

Then, as illustrated in FIG. 6, a groove 21b is formed by selectively etching the insulator 30 such that the other end part of the post 28a is exposed (S130), and then an opening 21a is formed by opening a portion of the insulation film 20a such that at least a portion of the bonding pad 26a is exposed (S140). Here, at least one of the above processes S130 and S140 can be performed by way of laser direct ablation (LDA). If the LDA method is used, no additional member is required, thus simplifying the overall process.

Figure 7:
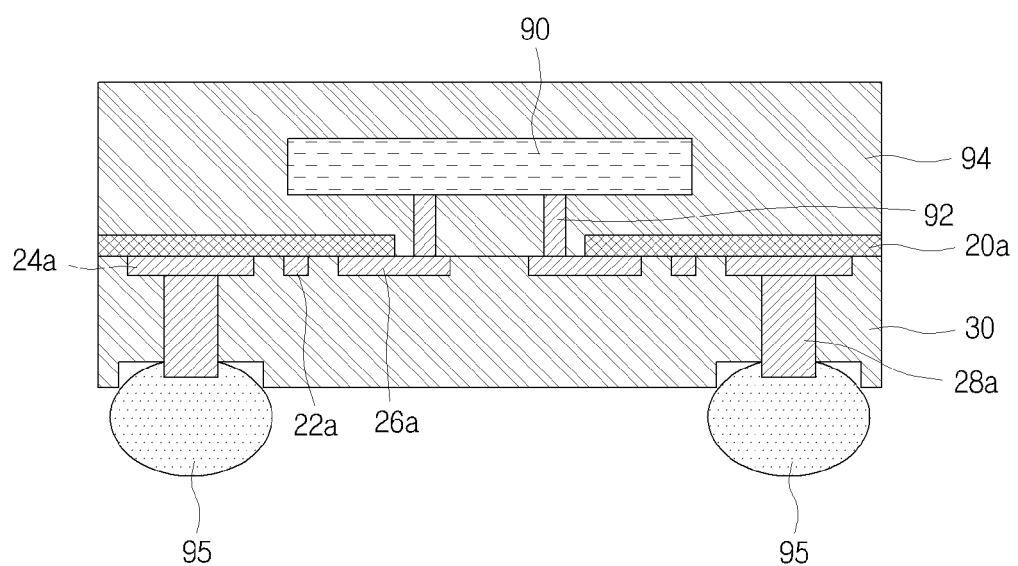

By exposing the other end part of the post 28a, the exposed other end part of the post 28a itself can function as a solder pad that is to be coupled with a solder ball 95 (shown in FIG. 7). Also, since the insulation film 20a excluding the portion where the opening 21a is formed still covers the circuit patterns 22a and 24a, the insulation film 20a can function as a solder resist for protecting the circuit patterns 22a and 24a.

In the method of manufacturing a single-layered printed circuit board in accordance with the present embodiment, processes for forming the solder pad and the solder resist do not have to be performed separately, thus simplifying the process and improving the production efficiency. Moreover, since the circuit patterns 22a and 24a are buried in the insulator 30, a fine pitch between the circuit patterns can be implemented, and thus circuit patterns with higher density can be also implemented.

Next, as illustrated in FIG. 7, a solder ball 95 is coupled to an end part of the exposed post 28a (S150), and then an electronic component 90 is mounted on an upper side of the insulator 30 such that the electronic component 90 is connected to the bonding pad 26a by, for example, a flip-chip bump 92 (S160). That is, the electronic component 90 is not mounted by a face-up method but mounted by a face-down method to be connected to the bonding pad 26a. With this flip-chip connection, a greater number of input/output paths can be obtained to provide an advantageous structure for higher density.

Then, the electronic component 90 mounted on the upper side of the insulator 30 can be covered and protected by a molding material 94.

Illustrated in FIGS. 6 and 7 is a single-layered printed circuit board that is manufactured through the above processes. The single-layered printed circuit board in accordance with the present embodiment includes the insulator 30, the bonding pad 26a and the circuit patterns 22a and 24a, which are provided on one surface of the insulator 30, the solder resist 20a, which covers the circuit patterns 22a and 24a and is coated on the insulator 30 such that at least a portion of the bonding pad 26a is exposed, the groove 21b, which is formed on the other surface of the insulator 30, and the post 28a, which penetrates through the insulator 30 and of which one end part is electrically connected to at least a portion of the circuit patterns 22a and 24a and the other end part is exposed through the groove 21b. Here, the bonding pad 26a and the circuit patterns 22a and 24a are buried in the insulator 30.

The solder ball 95 can be coupled to the exposed end part of the post 28a of the printed circuit board, and the electronic component 90 can be mounted on the upper side of the insulator 30. Here, the electronic component 90 is connected by a flip-chip method to be connected to the exposed bonding pad 26a.

Figure 8:
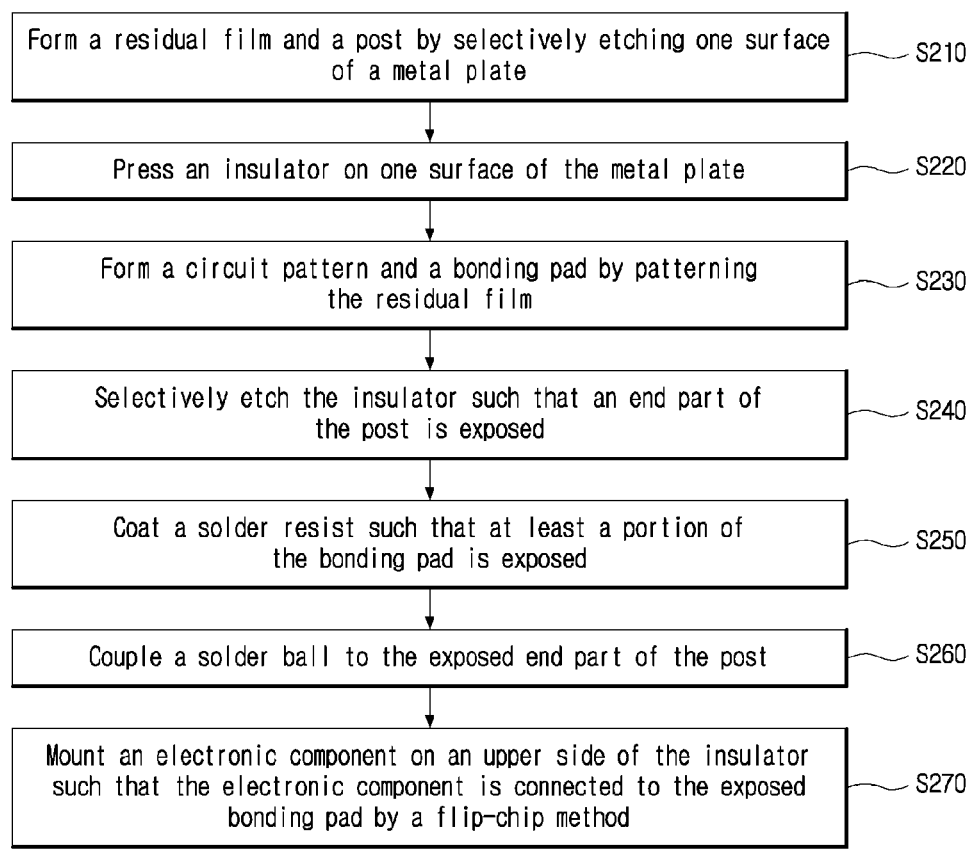
FIG. 8 is a flow diagram illustrating a method of manufacturing a single-layered printed circuit board in accordance with another embodiment of the present invention.
Figure 9:
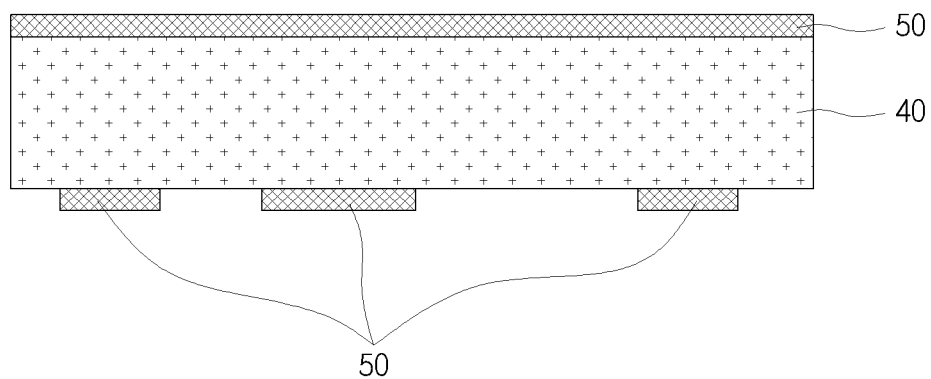
FIGS. 9 to 16 are diagrams illustrating each process of manufacturing a single-layered printed circuit board in accordance with another embodiment of the present invention.
Figure 10:
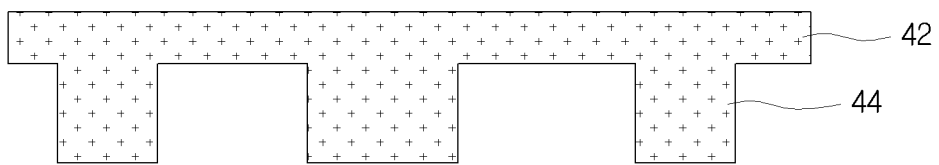

Next, the method of manufacturing a single-layered printed circuit board in accordance with another embodiment of the present invention will be described with reference to FIGS. 8 to 16. FIG. 8 is a flow diagram illustrating a method of manufacturing a single-layered printed circuit board in accordance with another embodiment of the present invention, and FIGS. 9 to 16 are diagrams illustrating each process of manufacturing a single-layered printed circuit board in accordance with another embodiment of the present invention.

First, a residual film 42 and a post 44 are formed by selectively etching one surface of a metal plate 40. Here, the residual film 42 refers to a part of the metal plate 40 that remains with a particular thickness without being processed when forming the post 44. In order to form the residual film 42 and the post 44, an etching resist 50 can be formed on the surface of the metal plate 40 having a sufficient thickness (refer to FIG. 9), and then the etching resist 50 can be removed after etching the metal plate 40 (refer to FIG. 10).

Figure 11:
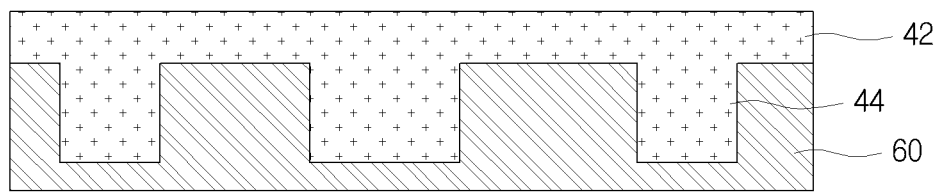

Then, as illustrated in FIG. 11, an insulator 60 is pressed on one surface of the metal plate 40. Accordingly, the post 44 can be buried in the insulator 60, and the residual film 42 can be stacked on the surface of the insulator 60.

Figure 12:
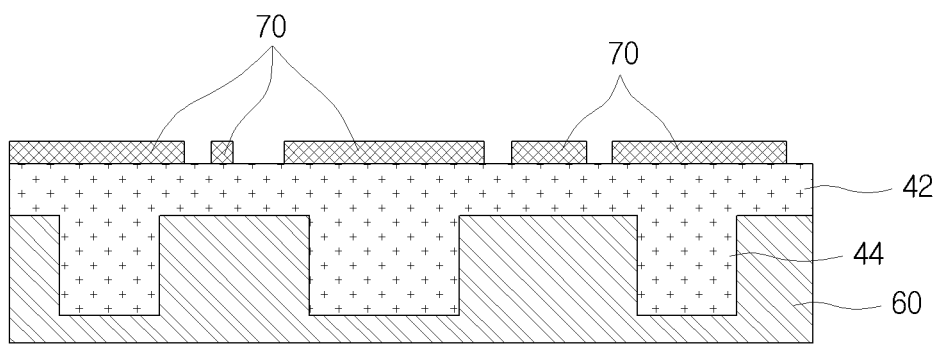
Figure 13:
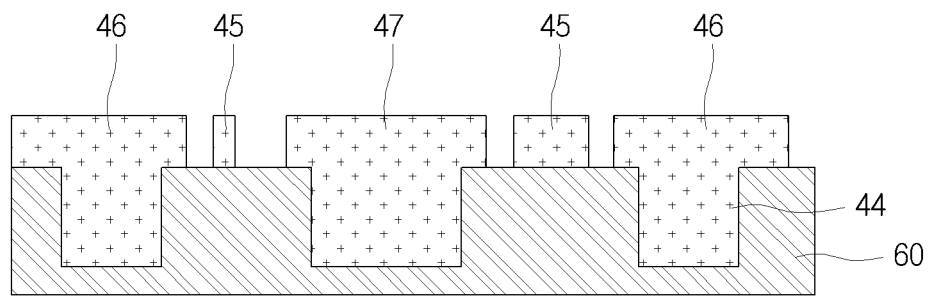

Next, circuit patterns 45 and 46 and a bonding pad 47 are formed by patterning the residual film 42. Here, like the previously described embodiment, the circuit pattern includes a wiring pattern 45 and a land 46. In order to form the circuit patterns 45 and 46 and the bonding pad 47, an etching process can be performed after an etching resist 70 is formed on the surface of the residual film 42, as illustrated in FIG. 12. FIG. 13 shows the circuit patterns 45 and 46 and the bonding pad 47 formed after the etching process is performed.

Figure 15:
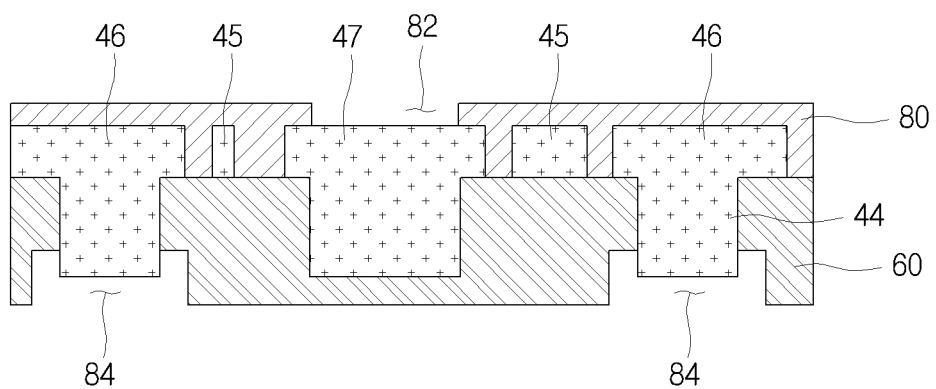

Then, a solder resist 80 (shown in FIG. 15) is coated such that at least a portion of the bonding pad 47 is exposed, and a groove 84 is formed by selectively etching the insulator 60 such that an end part of the post 44 is exposed (refer to FIG. 15). Here, exposing the end part of the post 44 by selectively etching the insulator 60 can be performed by way of laser direct ablation (LDA). If the LDA method is used, no additional member is required, and thus the overall process can be simplified.

Figure 14:
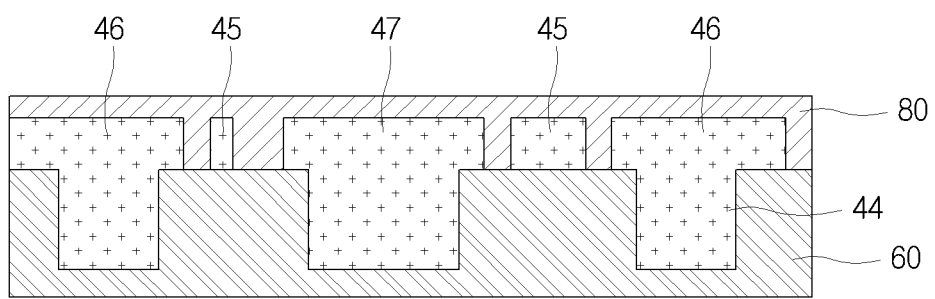

In order to coat the solder resist 80 such that at least a portion of the bonding pad 47 is exposed, it is also possible that the solder resist 80 is coated in such a way that the circuit patterns 45 and 46 and the bonding pad 47 are completely covered, as illustrated in FIG. 14, and then an opening 82 is formed by removing a portion of the solder resist 80 that corresponds to the location where the bonding pad 47 is formed, as illustrated in FIG. 15.

Figure 16:
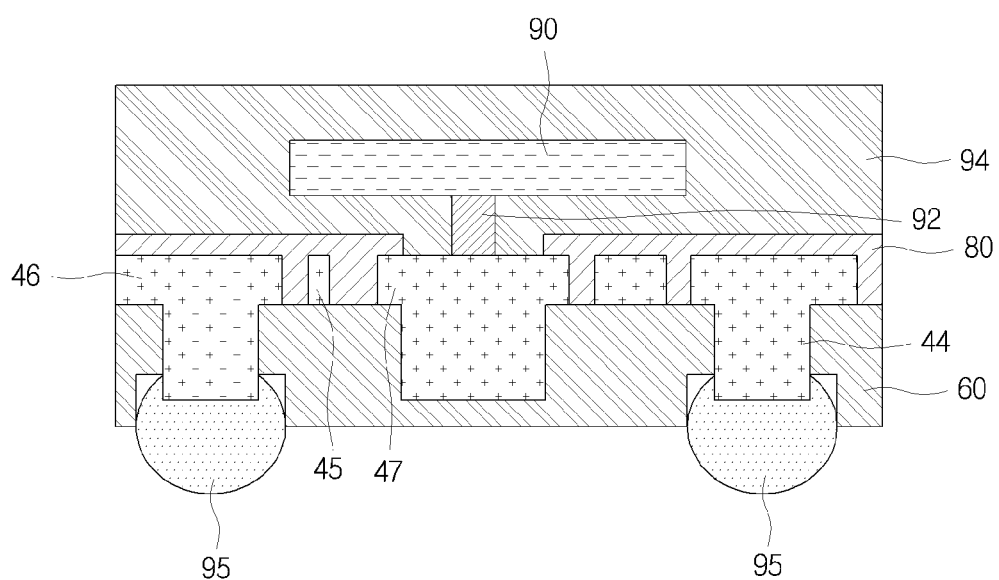

Next, as illustrated in FIG. 16, a solder ball 95 is coupled to an end part of the exposed post 44, and then an electronic component 90 is mounted on an upper side of the insulator 60 such that the electronic component 90 is connected to the bonding pad 47 by, for example, a flip-chip bump 92 (S160). That is, the electronic component 90 is not mounted by a face-up method but mounted by a face-down method to be connected to the bonding pad 47. With this flip-chip connection, a greater number of input/output paths can be obtained to provide an advantageous structure for higher density.

Then, the electronic component 90 mounted on the upper side of the insulator 60 can be covered and protected by a molding material 94.

Illustrated in FIGS. 15 and 16 is a single-layered printed circuit board that is manufactured through the above processes. The single-layered printed circuit board in accordance with the present embodiment includes the insulator 60, the bonding pad 47 and the circuit patterns 45 and 46, which are provided on one surface of the insulator 60, the solder resist 80, which covers the circuit patterns 45 and 46 and is coated on the insulator 60 such that at least a portion of the bonding pad 47 is exposed, the groove 84, which is formed on the other surface of the insulator 60, and the post 44, which penetrates through the insulator 60 and of which one end part is electrically connected to at least a portion of the circuit patterns 45 and 46 and the other end part is exposed through the groove 84. Here, the bonding pad 47 and the circuit patterns 45 and 46 are formed in such a way that the bonding pad 47 and the circuit patterns 45 and 46 are protruded from the surface of the insulator 60.

The solder ball 95 is coupled to the exposed end part of the post 44 of the printed circuit board, and the electronic component 90 can be mounted on the upper side of the insulator 60. Here, the electronic component 90 is connected by a flip-chip method to be connected to the exposed bonding pad 47.

By utilizing certain embodiments of the present invention as set forth above, a single-layered printed circuit board that can implement higher density and save the production cost can be provided.

While the spirit of the invention has been described in detail with reference to certain embodiments, the embodiments are for illustrative purposes only and shall not limit the invention. It is to be appreciated that those skilled in the art can change or modify the embodiments without departing from the scope and spirit of the invention.

As such, many embodiments other than those set forth above can be found in the appended claims.

What is claimed is:

1. A method of manufacturing a single-layered printed circuit board, the method comprising:

forming a bonding pad, a circuit pattern and a post on a surface of an insulation film, one end part of the post being electrically connected to at least a portion of the circuit pattern;

pressing an insulator on the surface of the insulation film, wherein the circuit pattern and the post are buried in the insulator;

forming a groove by selectively etching the insulator such that the other end part of the post is exposed; and opening a portion of the insulation film such that at least a portion of an upper surface of the bonding pad is exposed, wherein a height of the post is greater than a thickness of the circuit pattern, the circuit pattern is covered by the insulator so as not to be exposed and the other end part of the post is only exposed by the groove, an area of a transverse section of the groove is wider than an area of a transverse section of the other end of the post such that the other end of the post is positioned inside the groove and an outer perimeter of the other end of the post is exposed, and an electronic component is directly connected to the upper surface of the exposed bonding pad by a flip-chip method.

2. The method of claim 1, wherein the insulation film is made of a material comprising polyimide.

3. A method of manufacturing a single-layered printed circuit board, the method comprising:

forming a bonding pad, a circuit pattern and a post on a surface of an insulation film, one end part of the post being electrically connected to at least a portion of the circuit pattern;

pressing an insulator on the surface of the insulation film, wherein the circuit pattern and the post are buried in the insulator;

selectively etching the insulator such that the other end part of the post is exposed; and opening a portion of the insulation film such that at least a portion of the bonding pad is exposed, wherein the forming of the bonding pad, the circuit pattern and the post comprises:

adhering an insulation film to both surfaces of a separator;

forming the bonding pad, the circuit pattern and the post on the insulation film formed on both surfaces of the separator; and separating the insulation film on both surfaces of the separator from the separator.

4. The method of claim 1, wherein at least one of the selectively etching of the insulator and the opening of a portion of the insulation film is performed by way of laser direct ablation (LDA).

5. The method of claim 1, further comprising:

coupling a solder ball to the other end part of the post.

6. A method of manufacturing a single-layered printed circuit board, the method comprising:

forming a residual film and a post by selectively etching one surface of a metal plate;

pressing an insulator on one surface of the metal plate, wherein the post is buried in the insulator and the residual film is stacked on a surface of the insulator;

forming a circuit pattern which is connected to the post and a bonding pad by patterning the residual film;

forming a groove by selectively etching the insulator such that an end part of the post is exposed; and coating a solder resist such that at least a portion of the bonding pad is exposed, wherein a height of the post is greater than a thickness of the circuit pattern, and the circuit pattern is covered by the insulator so as not to be exposed and the end part of the post is only exposed by the groove.

7. The method of claim 6, wherein the selectively etching of the insulator is performed by way of laser direct ablation (LDA).

8. The method of claim 6, further comprising:

coupling a solder ball to the exposed end part of the post; and mounting an electronic component on an upper side of the insulator such that the electronic component is connected to the exposed bonding pad by a flip-chip method.

9. A single-layered printed circuit board comprising:

an insulator;

a bonding pad and a circuit pattern provided on one surface of the insulator;

a solder resist covering the circuit pattern and coated on the insulator such that at least a portion of an upper surface of the bonding pad is exposed;

a groove formed on a bottom surface of the insulator; and a post penetrating through the insulator, one end part of the post being electrically connected to at least a portion of the circuit pattern, and the other end part of the post being exposed through the groove, wherein a height of the post is greater than a thickness of the circuit pattern, the circuit pattern is covered by the insulator so as not to be exposed and the other end part of the post is only exposed by the groove, an area of a transverse section of the groove is wider than an area of a transverse section of the other end of the post such that the other end of the post is positioned inside the groove and an outer perimeter of the other end of the post is exposed, and an electronic component is directly connected to the upper surface of the exposed bonding pad by a flip-chip method.

10. The single-layered printed circuit board of claim 9, wherein the bonding pad and the circuit pattern are buried in the insulator.

11. The single-layered printed circuit board of claim 9, further comprising:

a solder ball coupled to the exposed end part of the post.

* * * * *